United States Patent
Jeong

(10) Patent No.: US 7,208,842 B2
(45) Date of Patent: Apr. 24, 2007

(54) SEMICONDUCTOR CHIP, MOUNTING STRUCTURE THEREOF, AND METHODS FOR FORMING A SEMICONDUCTOR CHIP AND PRINTED CIRCUIT BOARD FOR THE MOUNTING STRUCTURE THEREOF

(75) Inventor: Se-Young Jeong, Seoul (KR)

(73) Assignee: Samsung Electronics Co., Ltd, Gyeonggi-Do (KR)

( * ) Notice: Subject to any disclaimer, the term of this patent is extended or adjusted under 35 U.S.C. 154(b) by 28 days.

(21) Appl. No.: 10/911,705

(22) Filed: Aug. 5, 2004

(65) Prior Publication Data

US 2005/0087885 A1 Apr. 28, 2005

(30) Foreign Application Priority Data

Oct. 22, 2003 (KR) .................. 10-2003-0073863

(51) Int. Cl.
*H01L 23/48* (2006.01)
*H01L 23/52* (2006.01)
*H01L 29/40* (2006.01)

(52) U.S. Cl. .............. 257/781; 257/779; 257/750; 257/737; 257/778; 257/E23.069

(58) Field of Classification Search ........... 257/737, 257/738, 778, 779–781, 750, 773, 786
See application file for complete search history.

(56) References Cited

U.S. PATENT DOCUMENTS

| | | | |
|---|---|---|---|
| 5,431,328 A | 7/1995 | Chang et al. | |
| 5,914,536 A | 6/1999 | Shizuki et al. | |
| 5,956,605 A | 9/1999 | Akram et al. | |
| 6,127,735 A | 10/2000 | Berger et al. | |
| 6,297,560 B1 | 10/2001 | Capote et al. | |
| 6,388,322 B1 * | 5/2002 | Goossen et al. | ............ 257/737 |
| 6,410,415 B1 | 6/2002 | Estes et al. | |
| 6,492,197 B1 * | 12/2002 | Rinne | ............ 438/108 |
| 6,661,098 B2 * | 12/2003 | Magerlein et al. | ............ 257/777 |

(Continued)

FOREIGN PATENT DOCUMENTS

JP 08-213400 8/1996

(Continued)

OTHER PUBLICATIONS

Office Action from Korean Patent Office dated Jun. 30, 2005, for Korean patent application No. 10-2003-0073863.

*Primary Examiner*—Nitin Parekh
(74) *Attorney, Agent, or Firm*—Harness, Dickey & Pierce, P.L.C.

(57) ABSTRACT

A semiconductor chip for flip chip bonding, a mounting structure for the semiconductor chip, and methods for forming a semiconductor chip for flip chip bonding and for fabricating a printed circuit board for a mounting structure of a semiconductor chip are provided which may improve connection between a solder bump of the semiconductor chip and a substrate of the printed circuit board without having to use an underfill material. A polymer core of the solder bump may be supported between a 3-dimensional UBM and a 3-dimensional top surface metallurgy, so as to establish connection strength of the solder bump without using underfill material, and to absorb the stresses which may concentrate on the solder bump due to the difference in coefficients of thermal expansion between metals.

14 Claims, 12 Drawing Sheets

U.S. PATENT DOCUMENTS

| | | |
|---|---|---|
| 2002/0053467 A1 | 5/2002 | Gebauer et al. |
| 2002/0070463 A1 | 6/2002 | Chang et al. |
| 2002/0100972 A1 | 8/2002 | Kitajima et al. |

FOREIGN PATENT DOCUMENTS

| | | |
|---|---|---|
| JP | 11-233682 | 8/1999 |
| JP | 2000-228455 | 8/2000 |
| KR | 10-2001-0019775 | 3/2001 |
| KR | 2002-0001421 | 1/2002 |
| KR | 2003-0047514 | 6/2003 |

\* cited by examiner

SEMICONDUCTOR CHIP, MOUNTING STRUCTURE THEREOF, AND METHODS FOR FORMING A SEMICONDUCTOR CHIP AND PRINTED CIRCUIT BOARD FOR THE MOUNTING STRUCTURE THEREOF

CROSS REFERENCE TO RELATED APPLICATIONS

This U.S. non-provisional application claims priority under 35 U.S.C. §119 to Korean Patent Application No. 2003-73863, filed Oct. 22, 2003, the entire contents of which are incorporated herein by reference.

BACKGROUND OF THE INVENTION

1. Field of the Invention

The present invention relates to a semiconductor chip for flip chip bonding, a mounting structure of the semiconductor chip, and methods for forming the semiconductor chip and printed circuit board for mounting structure of the semiconductor chip.

2. Description of the Related Art

With the development of the semiconductor industry and the pressing demand of users for high integration density and high speed, semiconductor devices are moving in the direction of an increasing number of input/output pins with miniaturization of size. The resulting semiconductor packages range from insert mount type to surface mount type and may be configured as ball grid array packages and chip scale packages, for example.

Wire bonding techniques for interconnection of components on semiconductor devices include tape automated bonding (TAB) and flip chip bonding techniques. The flip chip bonding technique is generally superior to other interconnection techniques in terms of speed, integration density and miniaturization. The flip chip bonding technique has been employed in the manufacture of semiconductor chip packages.

FIG. 1 is a partial cross-sectional view of a conventional semiconductor chip for flip chip bonding. Referring to FIG. 1, a semiconductor chip 100 used in flip chip bonding typically has a bump of conductive material, such as a ball type solder bump 110, for example. A semiconductor substrate 101 includes an electrode pad 102 of Al or Cu for external electrical connection. A passivation layer 103 is formed on the substrate 101 such that a portion of the electrode pad 102 is exposed. The solder bump 110 is formed on the exposed electrode pad 102 and is connected to the electrode pad 102. A multi-layered under barrier metallurgy (UBM) 109 is formed between the solder bump 110 and the electrode pad 102.

The UBM 109 includes a barrier metal layer 107 formed on the exposed electrode pad 102 and a solder wetting layer 108 formed on the barrier metal layer 107. The barrier metal layer 107 may prevent solder material of the solder bump 110 from permeating into the electrode pad 102 and/or the semiconductor substrate 101. The solder wetting layer 108 may assist connection of the solder bump 110.

FIG. 2 is a partial cross-sectional view of the conventional semiconductor chip for flip chip bonding, as mounted on a printed circuit board. Referring to FIG. 2, a substrate 131 of a printed circuit board (PCB) 130 has a substrate contact pad 132. The solder bump 110 is electrically and physically connected to the substrate contact pad 132. An underfill resin (not shown) fills an area between the semiconductor chip 100 and the PCB 130 to protect the connected portion from the external environment, thereby improving the reliability of the interconnection.

The conventional semiconductor chip for flip chip bonding of FIG. 1 and mounting structure of FIG. 2 makes it difficult to achieve adequate chip miniaturization. For example, chip miniaturization requires reduced bump size and thus a reduced distance between the semiconductor chip 100 and PCB 130. However, the conventional art cannot efficiently perform an underfill process to fill the area between the semiconductor chip 100 and the PCB 130 due to the particle size of the underfill material.

In order to solve the problem, an underfill material having a reduced size than what is conventionally used is desired. Practically, however, the development of such an underfill material may result in a rise in cost. Further, the reduced bump size may result in a reduced area of connected portion(s), potentially reducing connection reliability.

SUMMARY OF THE INVENTION

An exemplary embodiment of the present invention is directed to a semiconductor chip for flip chip bonding. The chip may include a semiconductor substrate having integrated circuits; an electrode pad formed on the semiconductor substrate and connected to the integrated circuits, and a passivation layer formed on the semiconductor substrate so that at least a portion of the electrode pad is exposed. A first under barrier metallurgy (UBM) layer may be formed on the exposed portion of the electrode pad and passivation layer and connected to the electrode pad, and a second UBM layer may be formed on the first UBM layer. A solder layer may be formed on the first UBM layer so as to substantially cover the second UBM layer, and a solder bump may be formed on the solder layer and supported by the second UBM layer.

Another exemplary embodiment of the present invention is directed to a mounting structure of a semiconductor chip that includes a semiconductor chip as described above and a printed circuit board. The printed circuit board may include a substrate, contact pad formed on the substrate, and a supporting layer formed on the contact pad. The supporting layer may be formed so as to be substantially aligned across from the second UBM layer, so that the supporting layer and second UBM layer support the solder bump therebetween.

Another exemplary embodiment of the present invention is directed to a method of forming a semiconductor chip for flip chip bonding. In the method, an electrode pad may be formed on a semiconductor substrate, and a passivation layer may be formed on the semiconductor substrate so that at least a portion of the electrode pad is exposed. A first under barrier metallurgy (UBM) layer may be formed on the exposed portion of the electrode pad and passivation layer, and a second UBM layer may be formed on the first UBM layer. A solder layer may be formed on the first UBM layer so as to substantially cover the second UBM layer, and a solder bump may be formed on the solder layer.

Another exemplary embodiment of the present invention is directed to a method of fabricating a printed circuit board for a mounting structure of a semiconductor chip. In the method, a contact pad may be formed on a substrate, and a resin layer may be formed on the semiconductor substrate so that at least a portion of the contact pad is exposed to form an opening. A metallurgy layer (UBM) may be formed in the opening, and the resin layer may be removed so as to form the metallurgy layer into a 3-dimensional shape.

BRIEF DESCRIPTION OF THE DRAWINGS

These and other features and advantages of the exemplary embodiments of the present invention will be readily understood with reference to the following detailed description thereof provided in conjunction with the accompanying drawings, wherein like reference numerals designate like structural elements, and in which:

FIG. 3b is a cross-sectional view taken along the line I–I' of FIG. 3a.

DETAILED DESCRIPTION OF THE EXEMPLARY EMBODIMENTS

Figure 1:
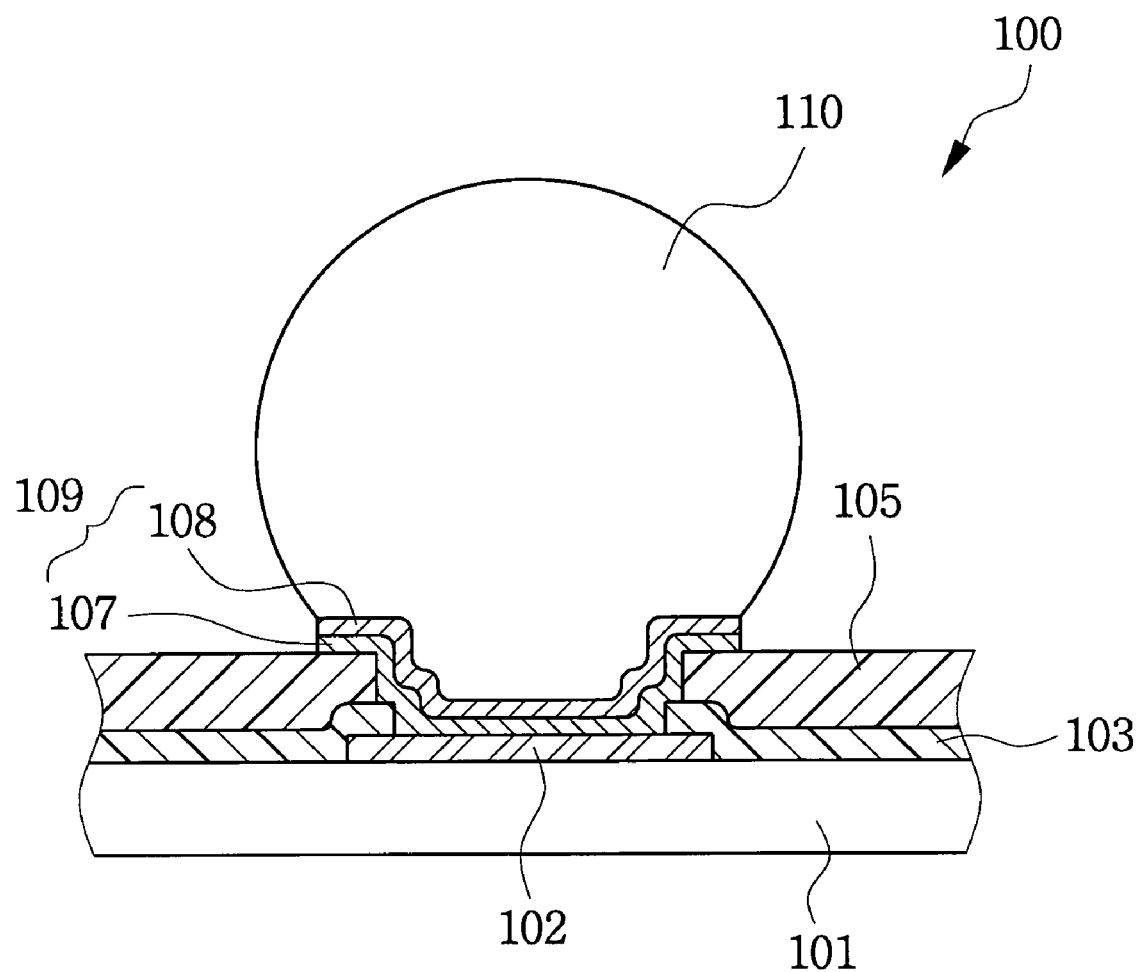
FIG. 1 is a partial cross-sectional view of a conventional semiconductor chip for flip chip bonding.
Figure 2:
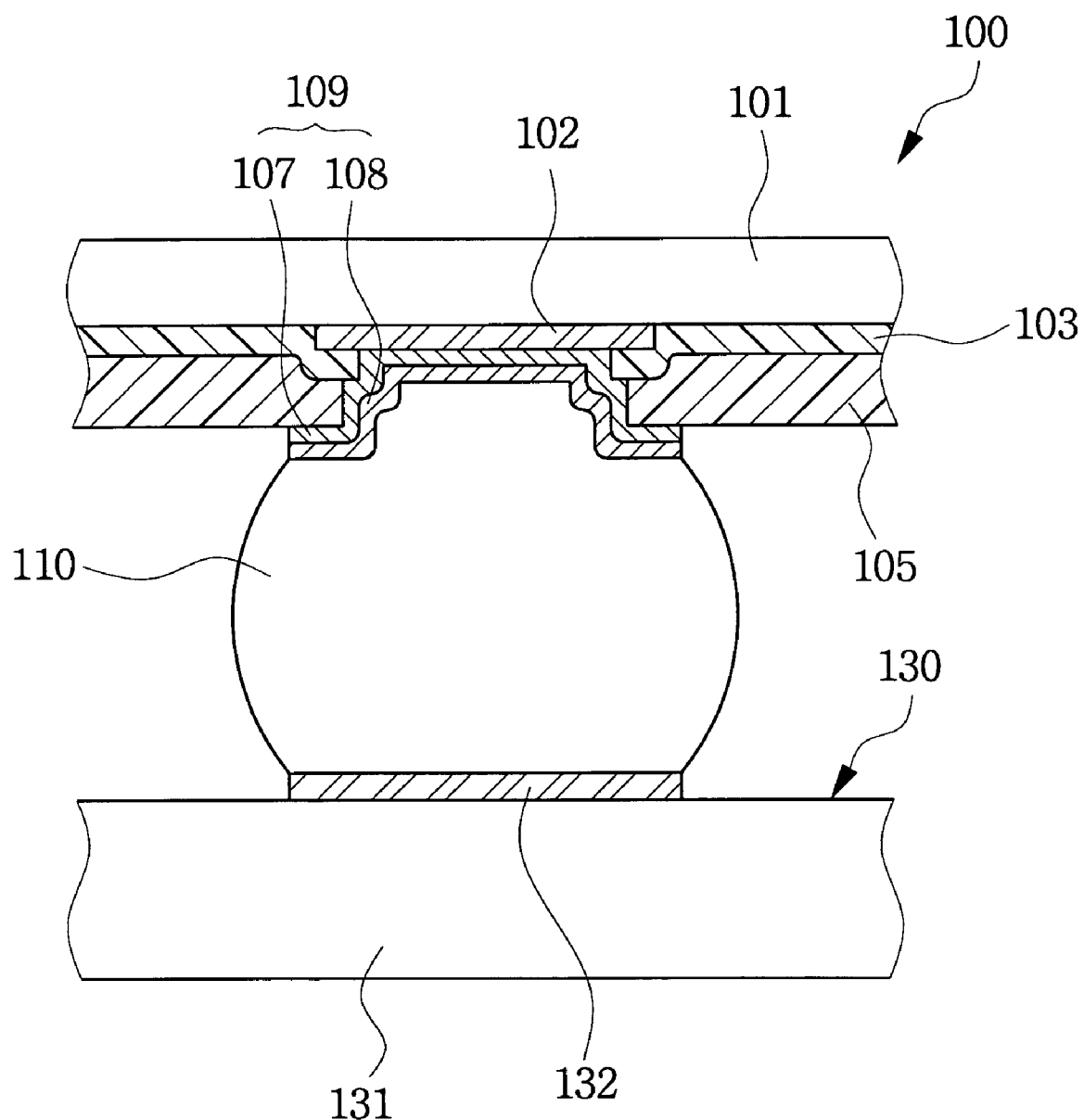
FIG. 2 is a partial cross-sectional view of the conventional semiconductor chip for flip chip bonding mounted on a printed circuit board.

The present invention will now be described more fully hereinafter with reference to the accompanying drawings, in which exemplary embodiments of the invention are shown. The exemplary embodiments of the invention may, however, be embodied in different forms and should not be construed as limited to the exemplary embodiments set forth herein. Rather, these exemplary embodiments are provided so that this disclosure will be thorough and complete, and will fully convey the scope of the invention to those skilled in the art. In the drawings, the thickness of layers and regions are exaggerated for clarity. It should be understood that when a layer is referred to as being "on" another layer or substrate, it can be directly on the other layer or substrate, or intervening layers may also be present. Like numbers refer to like elements throughout.

Figure 3A:
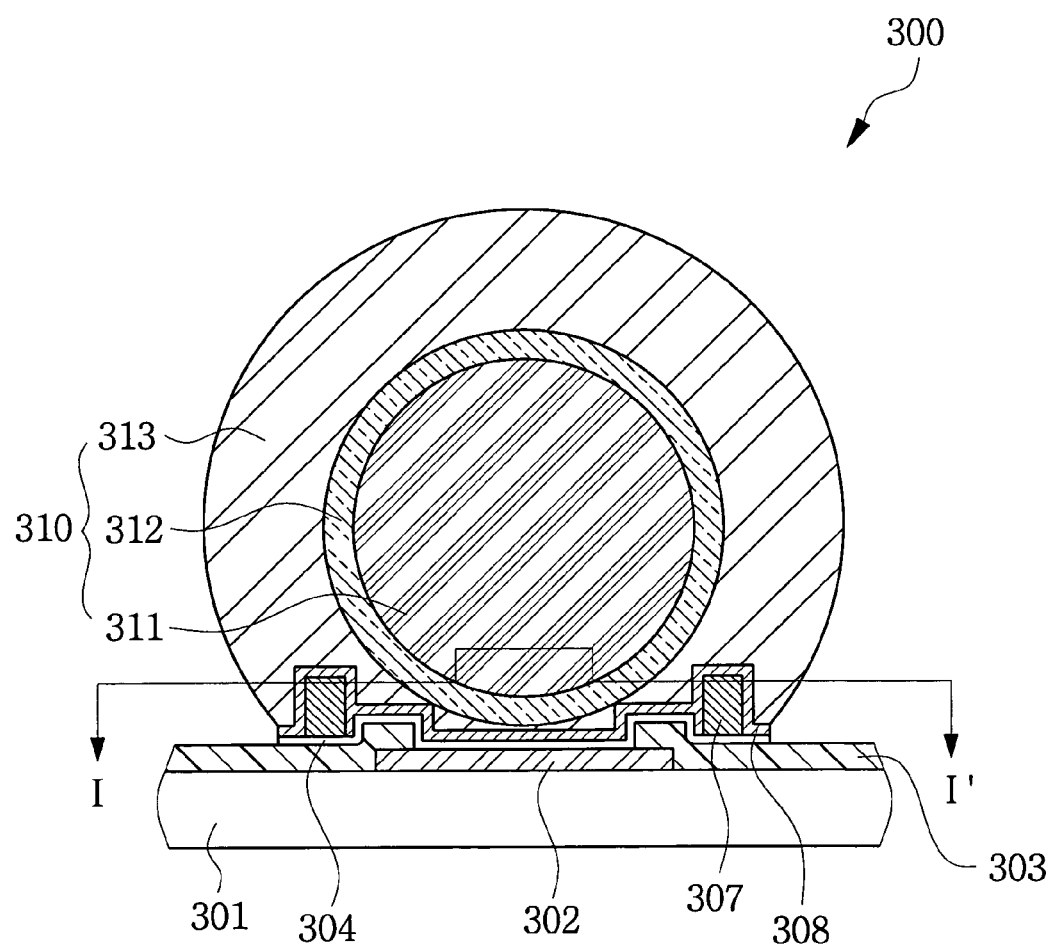
FIG. 3a is a partial cross-sectional view of a semiconductor chip for flip chip bonding in accordance with an exemplary embodiment of the present invention.
Figure 3B:
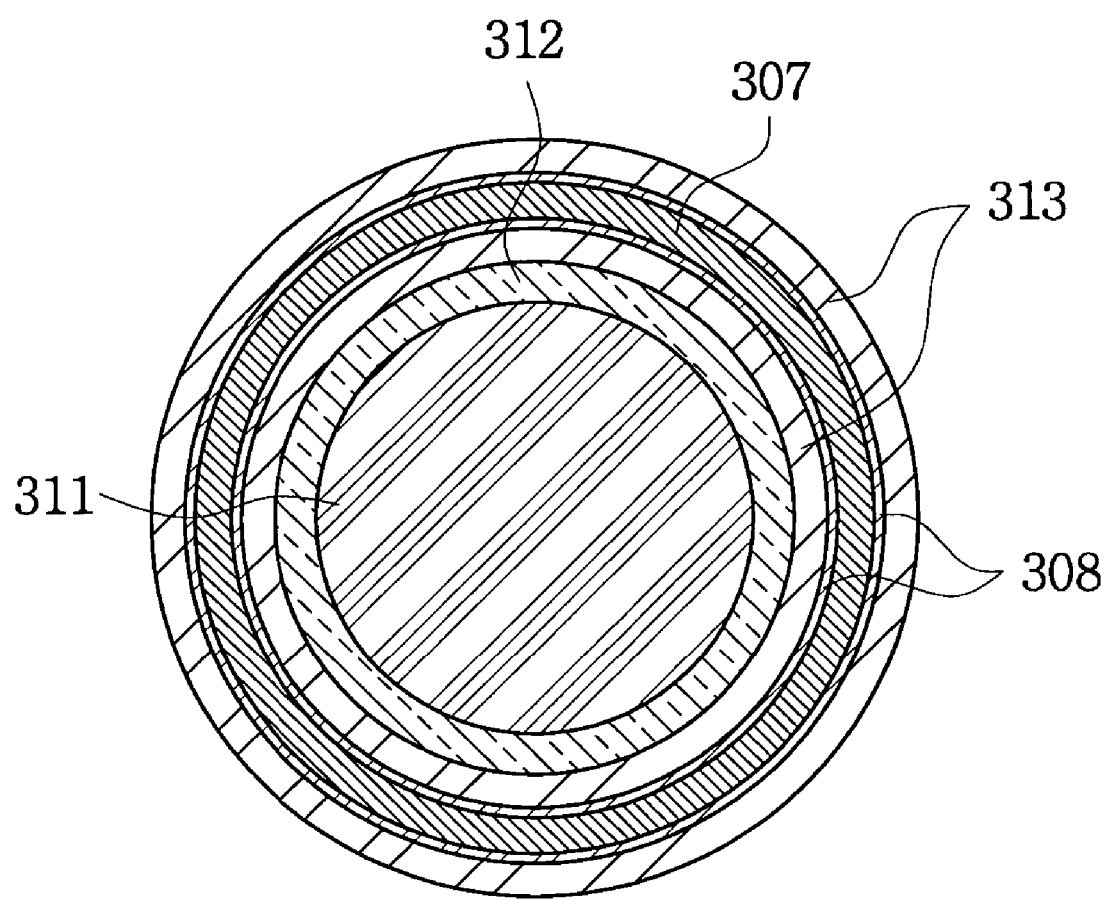

FIG. 3a is a partial cross-sectional view of a semiconductor chip for flip chip bonding in accordance with an exemplary embodiment of the present invention, and FIG. 3b is a cross-sectional view taken along the line I–I' of FIG. 3a.

Referring to FIGS. 3a and 3b, a semiconductor chip 300 for flip chip bonding may include a semiconductor substrate 301 having one or more integrated circuits. An electrode pad 302 may be formed on the semiconductor substrate 301 for external electrical connection. A passivation layer 303 may be formed on the semiconductor substrate 301, so that at least a portion of the electrode pad 302 is left exposed. A first under barrier metallurgy (UBM) layer 304 may be formed so as to substantially cover the exposed electrode pad 302 and the passivation layer 303. A 3-dimensional UBM layer 307 may be formed on the first UBM 304. A solder layer 308 may be formed on the first UBM 304 so as to substantially cover the 3-dimensional UBM 307. A solder bump 310 may be formed on the solder layer 308. The solder bump 310 may include a polymer core 311

The electrode pad 302 may serve as an input/output terminal and be composed of a metal such as Al or Cu, for example. The passivation layer 303 may be embodied as a silicon nitride film, a silicon oxide film or a polyimide, for example. A protection layer (not shown) may optionally be formed on the passivation layer 303.

The first UBM 304 layer may include materials such as Cr, Ti, Ni or TiW, alloys of these materials or combinations of these materials. The first UBM 304 layer may prevent solder material of the solder bump 310 from permeating into the electrode pad 302 and/or the semiconductor substrate 301.

The 3-dimensional UBM layer 307 may include Ni, Cu, Pd, Pt or an alloy thereof. The 3-dimensional UBM layer 307 may support the polymer core 311. The 3-dimensional UBM layer 307 may be formed in a shape of a ring having a given height. The formation of the 3-dimensional UBM layer 307 depends on the desired solder bump 310 to be formed. In other words, the 3-dimensional UBM 307 may be formed to a desired size and height so that the polymer core 311 of the solder bump 310 'fits' into a cavity or recess that is formed due to the shape and height of the 3-dimensional UBM layer 307, as shown in FIGS. 3a and 3b, for example.

The solder layer 308 may be composed of one or more of Sn, Pb, Ni, Au, Ag, Cu, Bi or an alloy thereof. The solder layer 308 may assist connection of the solder bump 310 by providing solder for the solder bump 310, which contains a relatively small amount of solder.

The solder bump 310 may be configured as a ball bump, for example, and includes the polymer core 311, an adhesive layer 312 surrounding the polymer core 311 (composed of a material having adequate adhesion properties such as nickel for example), and a bump solder layer 313 surrounding the adhesive layer 312. The adhesive layer 312 may be formed by a non-electrolytic plating method. Commercially, the diameter of the polymer core 311 may be about 100 μm, the thickness of the adhesive layer 312 may be about 3 μm and the thickness of the solder layer may be about 7 μm, although these are only exemplary dimensions. The diameter of the polymer core 311 and the thicknesses of the adhesive layer 312 and the bump solder layer 313 may vary based on a desired chip size or application.

Figure 4:
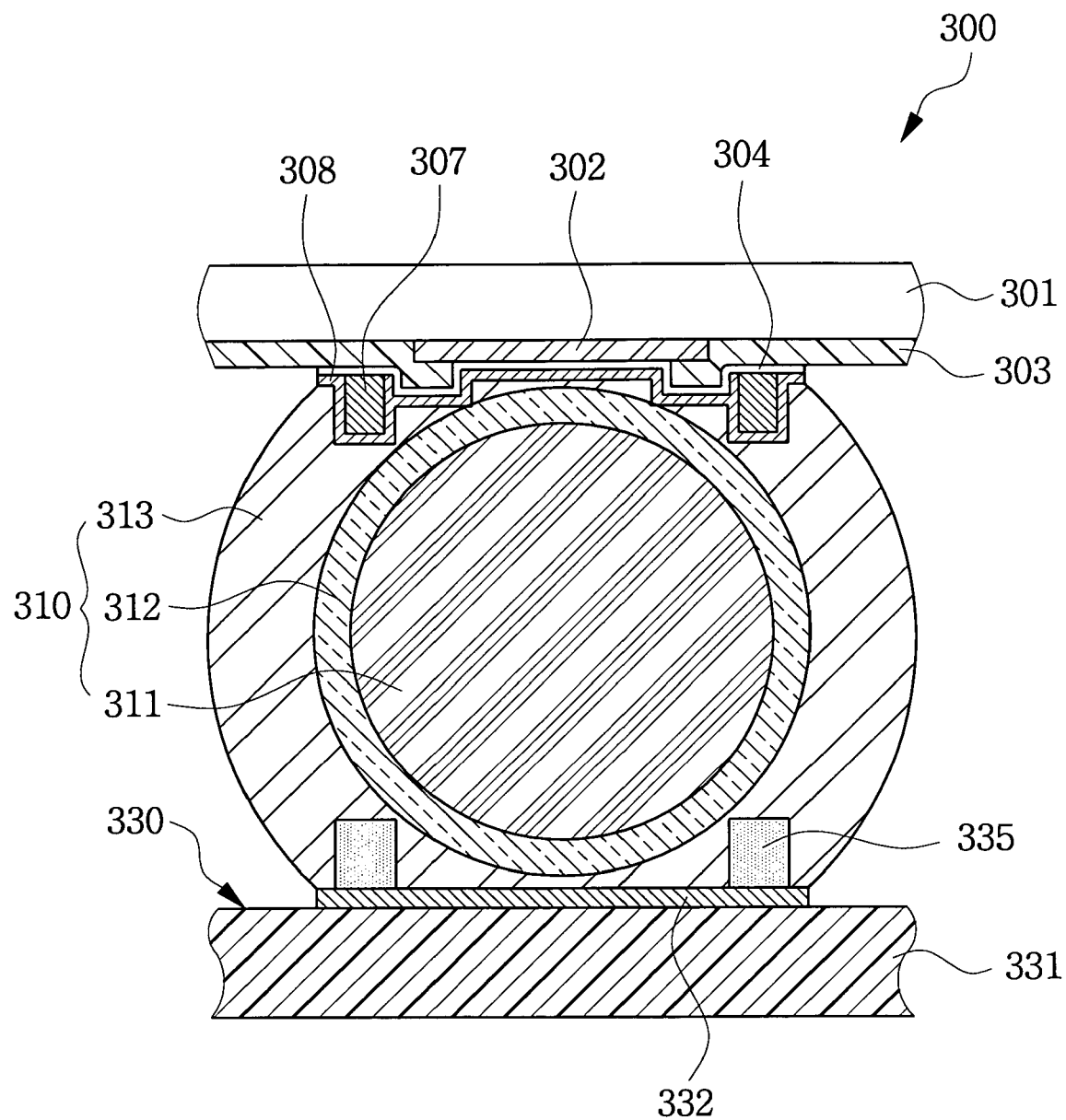
FIG. 4 is a partial cross-sectional view of a mounting structure of the semiconductor chip for flip chip bonding in accordance with an exemplary embodiment of the present invention.

FIG. 4 is a partial cross-sectional view of a mounting structure of the semiconductor chip for flip chip bonding in accordance with an exemplary embodiment of the present invention. The semiconductor chip 300 for flip chip bonding may be directly mounted on a PCB 330, as shown in FIG. 4. The PCB 330 may include a 3-dimensional top surface metallurgy layer 335 formed on a contact pad 332, which in turn is formed on a substrate 331. The 3-dimensional top surface metallurgy layer 335 may be formed in the shape of a ring having a given height, and may be located on contact pad 332 so as to correspond to the 3-dimensional UBM layer 307. In other words, the 3-dimensional top surface metallurgy layer 335 is formed so as to be a 'mirror image' of the 3-dimensional UBM layer 307 in terms of the spacing between raised portions of the layer 335. Thus, as shown in FIG. 4, the top surface metallurgy layer 335 is formed so as to be substantially aligned across from the 3-dimensional UBM layer 307 so that the top surface metallurgy layer 335 and 3-dimensional UBM layer 307 support the solder bump 310 therebetween.

As the semiconductor chip 300 is flip-chip bonded to the PCB 330, the solder bump 310 fits between the 3-dimensional UBM layer 307 and the top surface metallurgy 335. The polymer core 311 is supported at one end by the 3-dimensional UBM layer 307 and at the other end by the top surface metallurgy layer 335. The stresses may be absorbed by the polymer core 311 as a primary absorption structure, and then by the 3-dimensional UBM layer 307 and/or the 3-dimensional top surface metallurgy layer 335 as secondary absorption structures.

As described above, the semiconductor chip 300 may be configured so that the polymer core 311 fits into the 3-dimentional UBM layer 307, Such a configuration may provide a structure that can absorb the stresses which may be applied to the solder bump 310. The stresses may be absorbed first by the polymer core 311 as a primary absorption structure, and then by the 3-dimensional UBM layer 307 and/or the 3-dimensional top surface metallurgy 335 layer, each serving as a secondary absorption structure.

Figure 5:
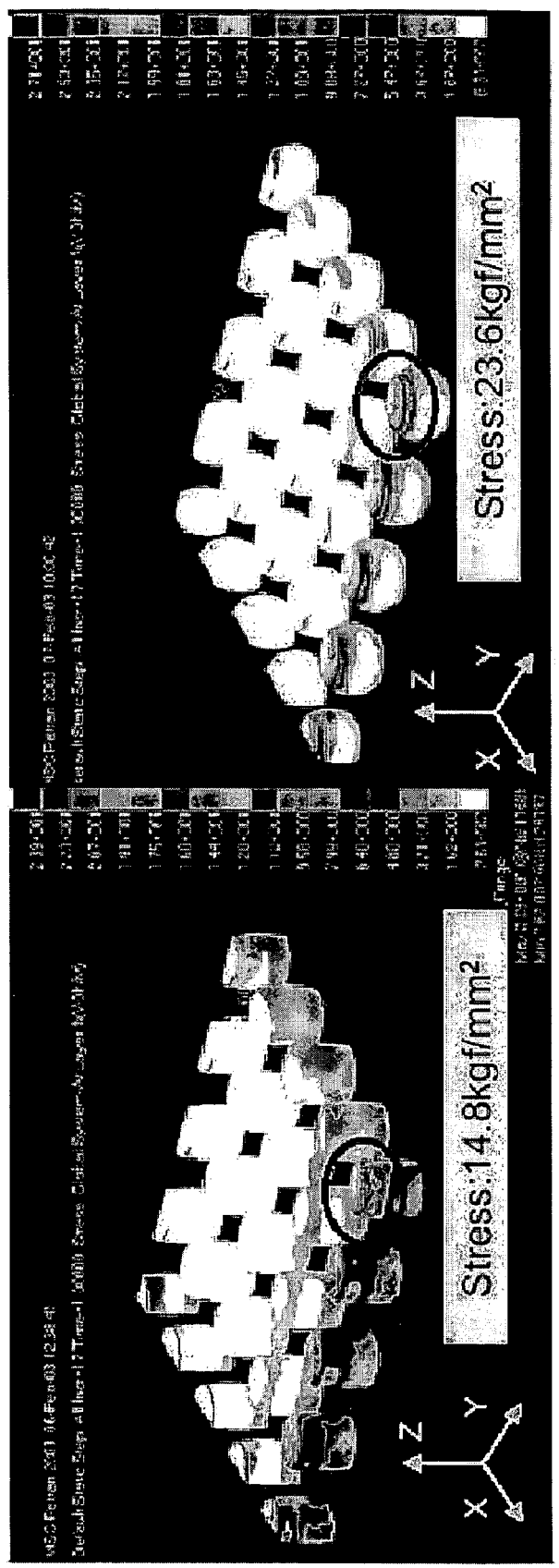
FIG. 5 is a view showing the simulation results of stresses applied to the chip to compare the exemplary embodiments of the present invention to the conventional art.

FIG. 5 is a view showing the simulation results of stresses applied to the chip to compare the exemplary embodiments of the present invention to the conventional art. The absorption effect may be illustrated by the following simulation results. Referring to FIG. 5, the stress applied to the conventional bump shown in the picture on the right-hand side of FIG. 5 is 23.6 kgf/mm$^2$, while the stress applied to the polymer core 311 in accordance with the exemplary embodiments of the present invention is 14.8 kgf/mm$^2$. Although this exemplary embodiment shows a 3-dimensional UBM layer 307 formed in the shape of a ring, this is only an exemplary shape; the UBM may be configured in various shapes so as to attain similar absorption effects.

FIGS. 6a through 6f are partial cross-sectional views of a method for manufacturing the semiconductor chip for flip chip bonding in accordance with an exemplary embodiment of the present invention. In particular, the views show the progression of steps in forming a semiconductor chip such as semiconductor chip 300 of FIGS. 3a and 3b.

Figure 6A:
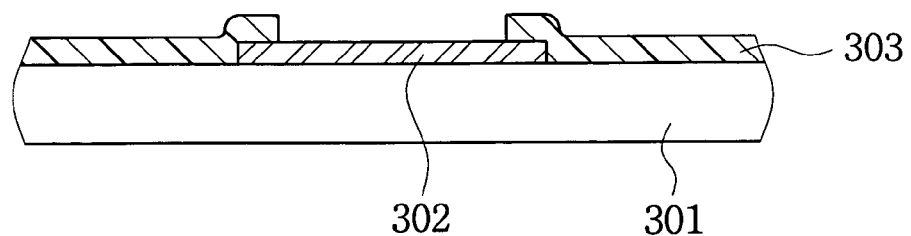
FIGS. 6a through 6f are partial cross-sectional views of a method for manufacturing the semiconductor chip for flip chip bonding in accordance with an exemplary embodiment of the present invention.

Referring to FIG. 6a, a semiconductor substrate 301 is provided. A plurality of electrode pads 302 are formed on the semiconductor substrate 301. A passivation layer 303 is formed such that at least a portion of the electrode pad 302 is exposed. As discussed above, the electrode pad 302 is made of metals such as Al or Cu.

Figure 6B:
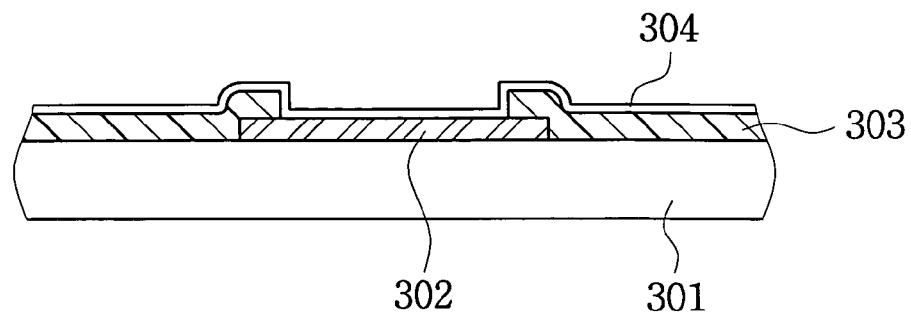

Referring to FIG. 6b, a first under barrier metallurgy (UBM) layer 304 may be formed so as to substantially cover the passivation layer 303 and the exposed electrode pad 302. The first UBM layer 304 may be formed by a sputtering method, for example, although.

Figure 6C:
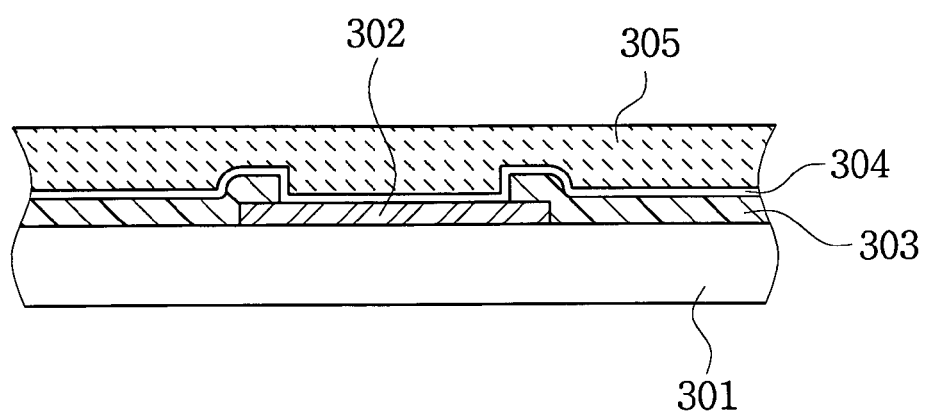

Referring to FIG. 6c, a photoresist layer 305 may be formed on the first UBM layer 304. The height of the photoresist layer 305 may be determined based on a desired size and/or shape of a solder bump to be formed, for example.

Figure 6D:
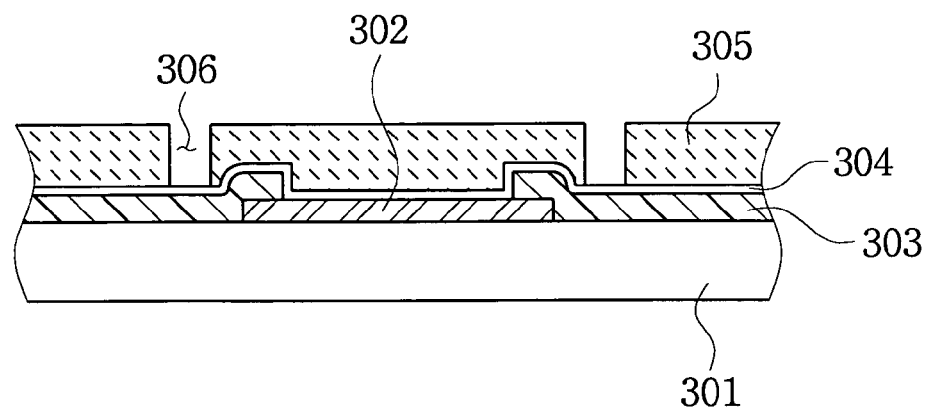

Referring to FIG. 6d, an opening 306 may be created in the photoresist layer 305 via known exposing and developing processes. The opening 306 is formed in the photoresist layer 305 adjacent to the electrode pad 302 and exposes a portion of the first UBM layer 304. The opening 306 may be formed in the shape of a ring, although the position and shape of the openings may vary based on a desired final chip size or structure.

Figure 6E:
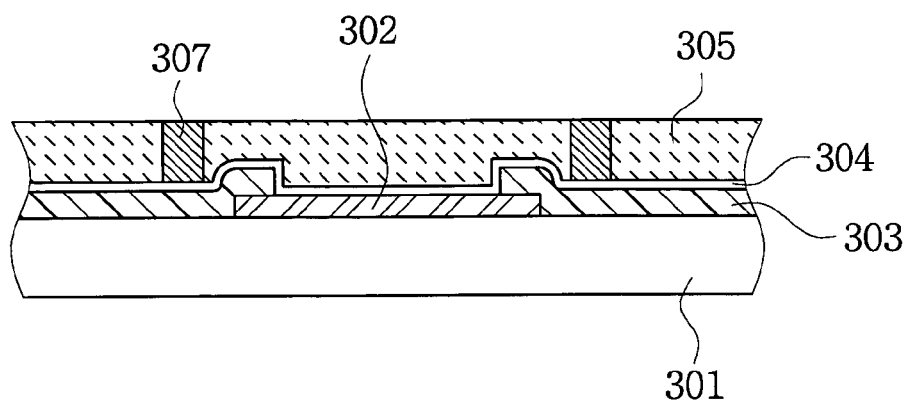

Referring to FIG. 6e, a 3-dimensional UBM layer 307 may be formed in the opening 306. The 3-dimensional UBM 307 may be formed using an electroplating process, for example, so as to have a ring-like shape having a given height, as shown in FIG. 3b.

Figure 6F:
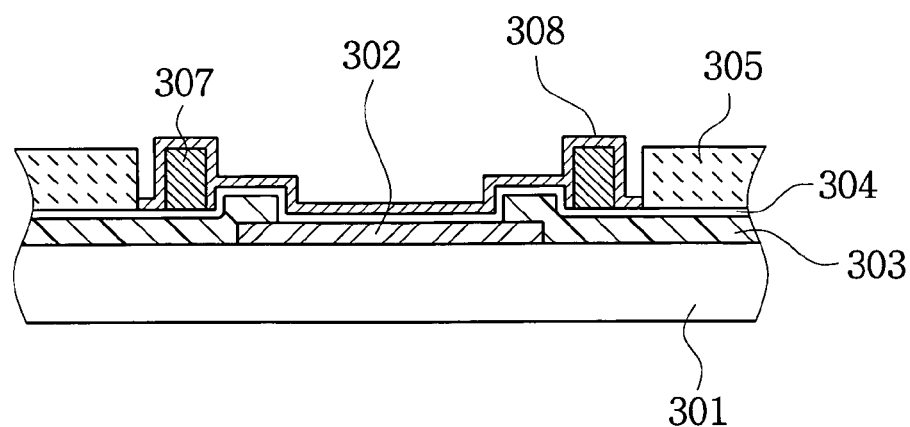

Referring to FIG. 6f, after removal of a given portion of the photoresist layer 305 adjacent to the electrode pad 302 to expose portions of the first UBM layer 304 and second, 3-dimensional UBM layer 307, a solder layer 308 may be formed on the exposed portions. The solder layer 308 may be formed to protect against chemical permeation into the electrode pads 302 and/or the 3-dimensional UBM layer 307, and to supplement the solder bump 310 with further solder. The solder layer 308 may be formed by known developing and plating processes, for example.

Next, the remaining photoresist layer 305 and portions of the first UBM layer 304 that are beneath the photoresist layer 305 (and not covered by the solder layer 308) are removed. A conventional etching process may be used to remove exposed portions of the first UBM layer 304 not covered by the solder layer 308. A solder bump 310 having a polymer core 311 may then be attached to complete the fabrication process. The solder bump 310 may be attached to the 3-dimensional UBM layer 307 using a known bump attaching apparatus, and may be subjected to a reflow process using a laser source.

Figure 7A:
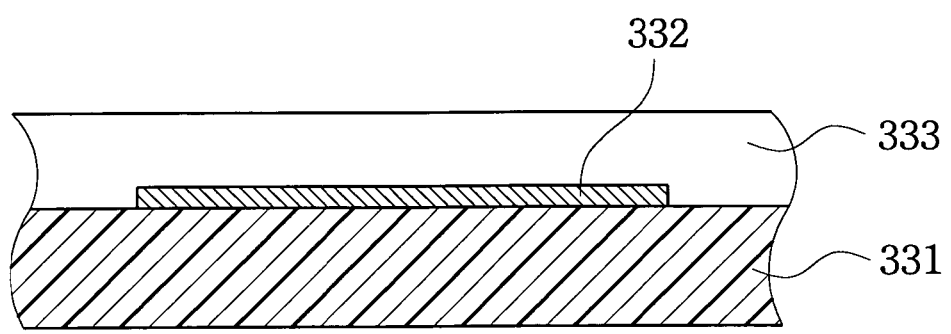
FIGS. 7a through 7d are partial cross-sectional views of a method for manufacturing a printed circuit board suitable for the mounting structure of the semiconductor chip for flip chip bonding.
Figure 7B:
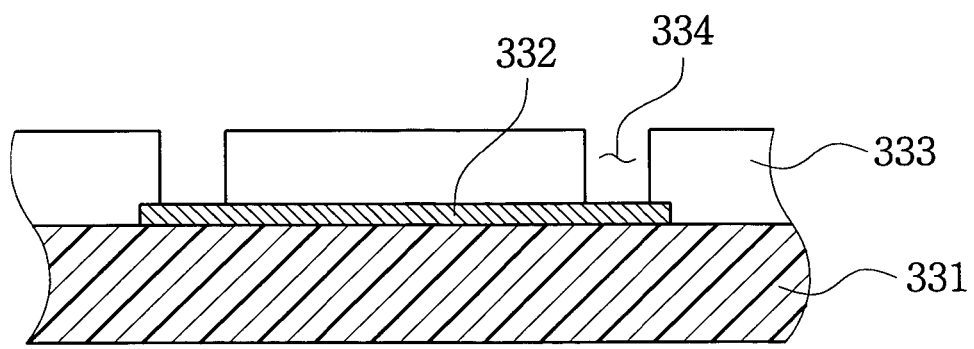
Figure 7C:
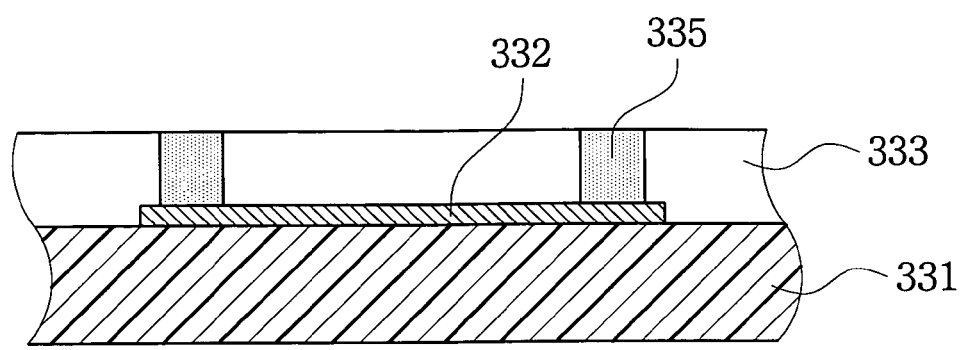
Figure 7D:
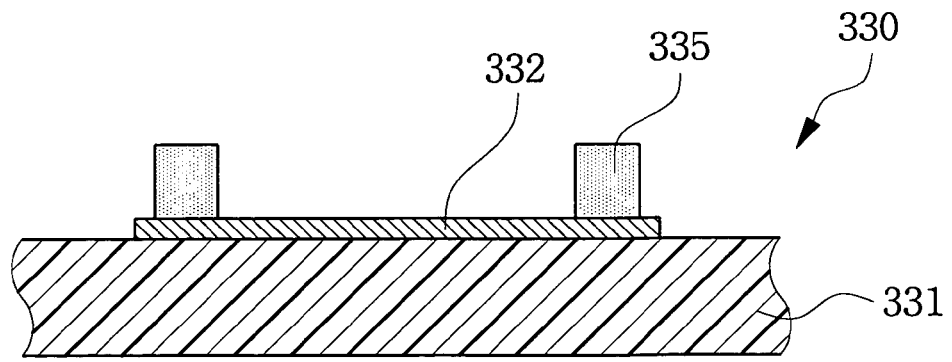

FIGS. 7a through 7d are partial cross-sectional views of a method for manufacturing a printed circuit board suitable for a mounting structure of a semiconductor chip for flip chip bonding. Referring to FIG. 7a, circuit patterns (not shown) and a contact pad 332 are formed on a substrate 331. A resin layer 333 may be formed so as to substantially cover the contact pad 332, as shown in FIG. 7a. Referring to FIG. 7b, an opening 334 may be formed through resin layer 333 to expose a portion of the contact pad 332. Referring to FIG. 7c, a top surface metallurgy layer 335 may be formed by filling the opening 334 with a metal material. After the resin layer 333 is removed by a suitable etching process, for example, the printed circuit board 330 has a 3-dimensional top surface metallurgy layer 335, as shown in FIG. 7d. Similar to the 3-dimensional UBM layer 307, the 3-dimensional top surface metallurgy layer 335 may be in a ring-like shape at a desired, given height.

Figure 8:
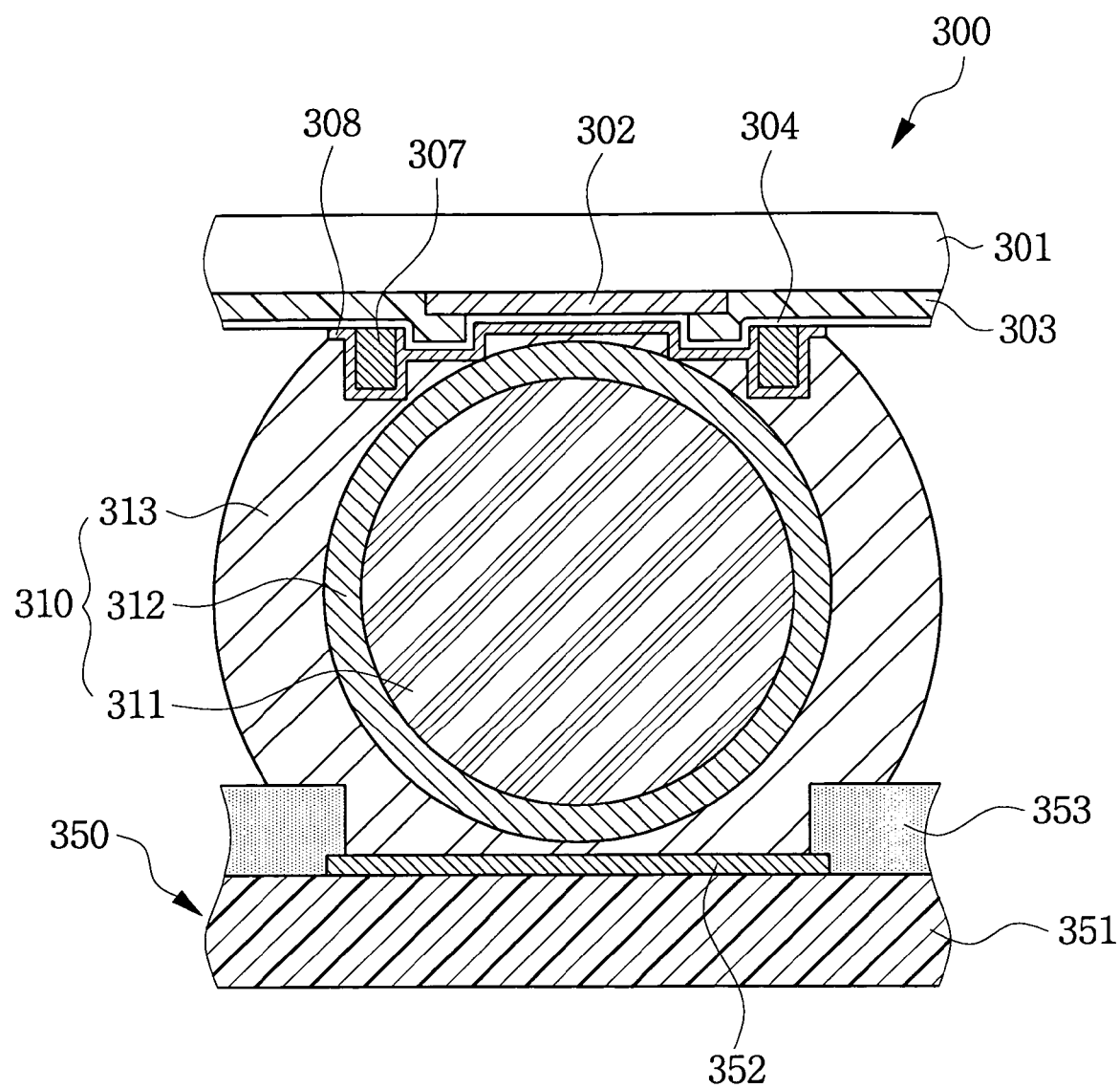
FIG. 8 is a partial cross-sectional view of a mounting structure of the semiconductor chip for flip chip bonding in accordance with another exemplary embodiment of the present invention.

FIG. 8 is a partial cross-sectional view of a mounting structure of a semiconductor chip for flip chip bonding in accordance with another exemplary embodiment of the present invention. FIG. 8 is somewhat similar to FIG. 4, thus the layers and/or structural components have substantially the same element numerals as FIG. 4, except that a PCB 350 may include a photoresist layer 353 formed on a portion of substrate 351 and on a portion of a contact pad 352. Thus, instead of forming a 3-dimensional top surface metallurgy layer 335 to support solder bump 310, the photoresist layer 353 is formed to support the polymer core 311 of the solder bump 310, thereby improving the reliability of the flip chip bonding.

In accordance with of the exemplary embodiments of the present invention, a mounting structure of a semiconductor chip may include a solder bump having a core, a 3-dimensional UBM layer and a 3-dimensional top surface metallurgy layer to provide sufficient connection strength for the solder bump without using underfill material, and may absorb the stresses which may concentrate on the solder bump due to differences in the coefficients of thermal expansion of various metals of the layers and/or components of the mounting structure.

Although the exemplary embodiments of the present invention have been described in detail hereinabove, it should be understood that many variations and/or modifications of the basic inventive concepts herein taught, which may appear to those skilled in the art, will still fall within the spirit and scope of the exemplary embodiments of the present invention as defined in the appended claims.

What is claimed is:

1. A semiconductor chip for flip chip bonding, the chip comprising:
   a semiconductor substrate having integrated circuits;
   an electrode pad formed on the semiconductor substrate and connected to the integrated circuits;
   a passivation layer formed on the semiconductor substrate so that at least a portion of the electrode pad is exposed;
   a first under barrier metallurgy (UBM) layer formed on the exposed portion of the electrode pad and passivation layer and connected to the electrode pad;
   a second UBM layer formed on the first UBM layer;
   a solder layer directly formed on the first UBM layer so as to substantially cover the second UBM layer; and
   a solder bump formed on the solder layer and supported by the second UBM layer.

2. The semiconductor chip of claim 1, wherein the second UBM layer is a 3-dimensional UBM.

3. The semiconductor chip of claim 2, wherein
   the solder bump includes a polymer core, and
   the 3-dimensional UBM supports the solder bump so that the polymer core fits into the 3-dimensional UBM.

4. The semiconductor chip of claim 2, wherein the 3-dimensional UBM is formed in the shape of a ring.

5. The semiconductor chip of claim 2, wherein the 3-dimensional UBM is composed of metals selected from a group consisting of Ni, Cu, Pd, Pt or an alloy thereof.

6. The semiconductor chip of claim 1, wherein the solder bump is a ball bump.

7. The semiconductor chip of claim 1, wherein the solder layer is composed of metals selected from a group consisting of Sn, Pb, Ni, Au, Ag, Cu, Bi or an alloy thereof.

8. A mounting structure of a semiconductor chip, comprising:
   a semiconductor chip, and
   a printed circuit board,
   the semiconductor chip including:
   a semiconductor substrate having integrated circuits,
   an electrode pad formed on the semiconductor substrate and connected to the integrated circuits,
   a passivation layer formed on the semiconductor substrate so that at least a portion of the electrode pad exposed,
   a first under barrier metallurgy (UBM) layer formed on the exposed portion of the electrode pad and the passivation layer,
   a second UBM layer formed on the first UBM layer,
   a solder layer directly formed on the first UBM layer so as to substantially cover the second UBM layer, and
   a solder bump having formed on the solder layer and supported by the second UBM layer; and
   the printed circuit board including:
   a substrate;
   a contact pad formed on the substrate; and
   a supporting layer formed on the contact pad, the supporting layer being formed so as to be substantially aligned across from the second UBM layer so that the supporting layer and second UBM layer support the solder bump therebetween.

9. The mounting structure of claim 8, wherein the second UBM layer is a 3-dimensional UBM.

10. The mounting structure of claim 9, wherein the 3-dimensional UBM is formed in the shape of a ring at a given height.

11. The mounting structure of claim 9, wherein
    the solder bump includes a polymer core, and
    the polymer core is bump-bonded such that the polymer core fits between the 3-dimensional UBM and the supporting layer.

12. The mounting structure of claim 8, wherein the supporting layer is a 3-dimensional top surface metallurgy.

13. The mounting structure of claim 12, wherein the 3-dimensional top surface metallurgy is formed in the shape of a ring at a given height.

14. The mounting structure of claim 8, wherein the supporting layer is a photo solder resist layer.

* * * * *